(12) United States Patent
Park (10) Patent No.: US 11,355,419 B2
(45) Date of Patent: Jun. 7, 2022

(54) POWER SEMICONDUCTOR MODULE (71) Applicant: AMOSENSE CO., LTD., Cheonan-si (KR)

(72) Inventor: Ik-Seong Park, Seoul (KR)

(73) Assignee: Amosense Co., Ltd., Cheonan (KR)

( * ) Notice: Subject to any disclaimer, the term of this patent is extended or adjusted under 35 U.S.C. 154(b) by 71 days.

(21) Appl. No.: 16/960,426

(22) PCT Filed: Jan. 11, 2019

(86) PCT No.: PCT/KR2019/000437
§ 371 (c)(1),
(2) Date: Jul. 7, 2020

(87) PCT Pub. No.: WO2019/139394
PCT Pub. Date: Jul. 18, 2019

(65) Prior Publication Data
US 2020/0335422 A1 Oct. 22, 2020

(30) Foreign Application Priority Data
Jan. 11, 2018 (KR) .................. 10-2018-0003978

(51) Int. Cl.
*H01L 23/34* (2006.01)
*H01L 23/433* (2006.01)
(Continued)

(52) U.S. Cl.
CPC ........ *H01L 23/4334* (2013.01); *H01L 23/498* (2013.01); *H01L 24/32* (2013.01);
(Continued)

(58) Field of Classification Search
CPC .......... H01L 23/4334; H01L 23/49834; H01L 23/36; H01L 23/3672; H01L 23/498; H01L 23/34
(Continued)

(56) References Cited
U.S. PATENT DOCUMENTS 5,251,100 A * 10/1993 Fujita .................... H01L 23/473
361/689
5,744,863 A * 4/1998 Culnane ................ H01L 21/563
257/704

(Continued)

FOREIGN PATENT DOCUMENTS

JP 2010225720 A 10/2010
KR 1020060056394 A 5/2006

(Continued)

OTHER PUBLICATIONS

International Search Report and Written Opinion from related PCT Application No. PCT/KR2019/000437, dated Apr. 22, 2019, 10 pages.

*Primary Examiner* — Nitin Parekh
(74) *Attorney, Agent, or Firm* — Brooks, Cameron & Huebsch, PLLC (57) ABSTRACT

The present invention relates to a power semiconductor module including a first heat dissipation substrate, a semiconductor chip, a lead plate, a PCB, and a heat dissipation plate that are packaged within a casing, wherein dualization of a heat dissipation structure is applied to facilitate superior heat dissipation performance compared to a conventional power semiconductor module.

11 Claims, 7 Drawing Sheets

(51) Int. Cl.
 *H01L 23/498* (2006.01)
 *H01L 23/00* (2006.01)
 *H01L 23/367* (2006.01)

(52) U.S. Cl.
 CPC ...... *H01L 23/3672* (2013.01); *H01L 23/3677* (2013.01); *H01L 2224/32505* (2013.01)

(58) Field of Classification Search
 USPC ......................................................... 257/713
 See application file for complete search history.

(56) References Cited

U.S. PATENT DOCUMENTS

| | | | | |
|---|---|---|---|---|
| 6,437,240 | B2 * | 8/2002 | Smith | H01L 21/563 174/541 |
| 7,977,775 | B2 * | 7/2011 | Yato | H01L 24/37 257/666 |
| 2001/0045644 | A1 * | 11/2001 | Huang | H01L 23/49575 257/718 |
| 2006/0223237 | A1 * | 10/2006 | Combs | H01L 23/3128 257/E23.101 |
| 2013/0062743 | A1 * | 3/2013 | Kim | H01L 23/49833 257/675 |
| 2015/0255441 | A1 * | 9/2015 | Lamorey | H01L 23/562 438/107 |

FOREIGN PATENT DOCUMENTS

| | | |
|---|---|---|
| KR | 1020130029267 A | 3/2013 |
| KR | 1020130045596 A | 5/2013 |
| KR | 1020130059147 A | 6/2013 |
| KR | 20150089609 A | 8/2015 |

\* cited by examiner

POWER SEMICONDUCTOR MODULE

TECHNICAL FIELD

The present invention relates to a power semiconductor module. More particularly, the present invention relates to a power semiconductor module with improved heat dissipation performance.

BACKGROUND ART

A power semiconductor module is a semiconductor module that is optimized for power conversion or control by making a power semiconductor chip as a module in a package. In particular, an insulated-gate bipolar transistor (IGBT) is a type of power semiconductor and is a semiconductor for high-power switching.

A switching function that blocks or allows the flow of electricity may be implemented with other components or circuits. However, products requiring precise operation need dedicated components with quick operation speed and low power loss.

However, a transistor, which is a switching semiconductor, has high productivity, but has a complex circuit configuration and a slow operation speed. A MOSFET consumes low power and has quick operation speed, but is costly. The IGBT is a combination of only advantages of the transistor and the MOSFET.

A power semiconductor module including an IGBT module, and the like has a structure in which a substrate is placed on a base plate and a semiconductor chip is placed on the substrate.

Herein, the semiconductor chip is electrically connected to a substrate through bonding with a wire made of an aluminum material, and also the substrate has a structure connected to a PCB through wire bonding. Thermal resistance is very important for heat dissipation characteristics. Referring to the thermal resistance (W/m-K) of each material, an AlN substrate, which is a ceramic substrate, has a thermal resistant of 180 W/m-K; $Al_2O_3$ has 21 W/m-K; $Si_3N_4$ has 80 W/m-K; copper (Cu), which is metal, has 390 W/m-K; solder has 35 to 60 W/m-K; and a doped silicon (doped Si) of a semiconductor chip has about 70 W/m-K. Therefore, development is required to solve the heat problem of the power semiconductor module.

Figure 1:
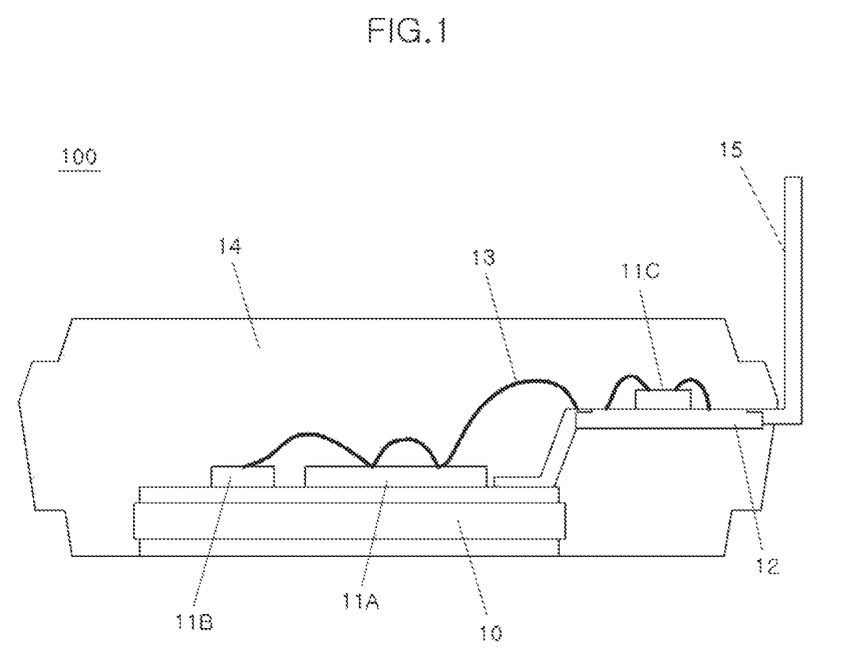
FIG. 1 and FIG. 2 show a conventional power semiconductor module.
Figure 2:
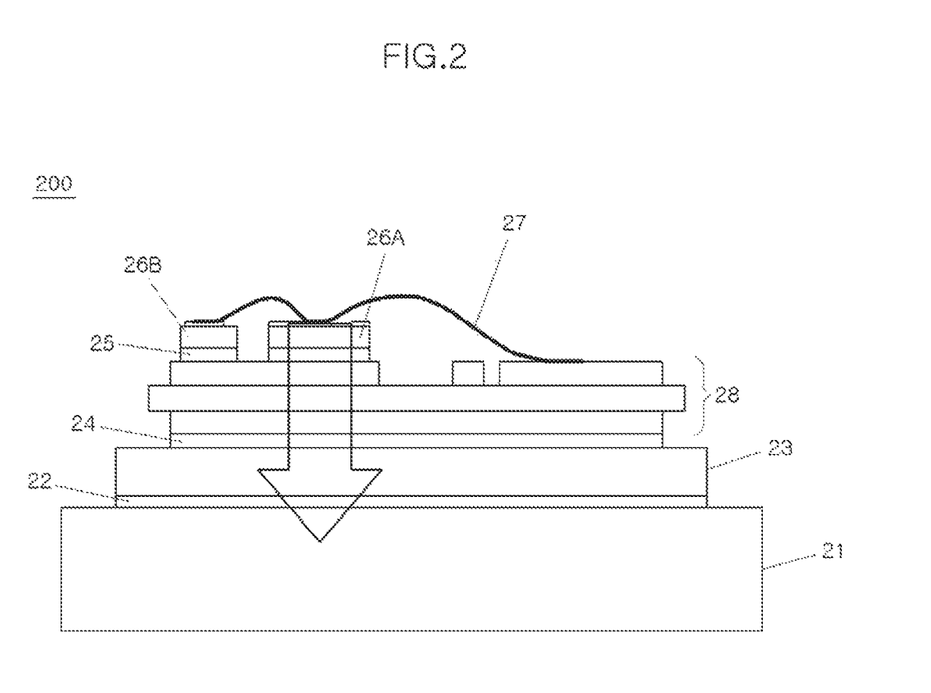

FIG. 1 and FIG. 2 show a conventional power semiconductor module.

As shown in FIG. 1, a power semiconductor module 100 has a structure in which an IGBT 11A and a diode 11B are attached on a substrate 10; a bonding wire 13 connects the IGBT 11A, the diode 11B, and a control IC 11C; a PCB 12 positioned aside is connected by a lead frame 15; and these elements are packaged within a casing.

In addition, as shown in FIG. 2, a power semiconductor module 200 has a packaged structure in which a base plate 23 is formed on a heat sink 21 through a thermal grease 22; the base plate 23 is attached to a substrate 28 via a lower base plate solder 24; an IGBT 26A and a diode 269 are attached to the substrate 28 via an upper chip solder 25; and the IGBT 26A and the diode 26B are connected by a lead frame 27.

The power semiconductor modules of FIG. 1 and FIG. 2 make the heat dissipate through the heat sink, or the like provided below the lower surface of the base plate. However, in these structures, the heat is dissipated only in one direction, so that there is a limit in dissipating the heat from the power semiconductor module. Accordingly, development is required to improve the heat dissipation structure. In patent document 1, a conventional power semiconductor module is disclosed.

The above information disclosed in this Background section is only for enhancement of understanding of the background of the invention and it may therefore contain information that does not form the related art that is already known to a person of ordinary skill in the art.

(Patent document 1) Korean Patent Application Publication No. 10-2015-0089609

DISCLOSURE

Technical Problem

Accordingly, the present invention has been made keeping in mind the above problems, and the present invention is directed to providing a power semiconductor module with improved heat dissipation performance.

Technical Solution

The present invention provides a power semiconductor module including: a first heat dissipation substrate; a semiconductor chip positioned on the first heat dissipation substrate, and bonded in a form of a flip chip to the first heat dissipation substrate; and a thermal interface material layer (TIM layer) positioned on the semiconductor chip.

According to an example of the present invention, a PCB may be formed on the TIM layer.

In addition, a second heat dissipation substrate may be formed on the PCB, and the second heat dissipation substrate may be of a flat type, a pin type, or a fin type.

According to another example of the present invention, a lower portion of the second heat dissipation substrate may be formed penetrating through the PCB and being in contact with the TIM.

In addition, a first copper layer may be formed at an upper side of the TIM layer, a second copper layer may be formed at a lower side of the TIM layer, and the lower portion of the second heat dissipation substrate may be in contact with the first copper layer at the upper side of the TIM layer.

According to another example of the present invention, a lead plate may be provided on the semiconductor chip, and an adhesive layer may be provided to attach the lead plate and the PCB.

In addition, the adhesive layer may be composed of nanoparticles each having a diameter of 1 to 50 nm, and may have a porous structure.

According to another example of the present invention, the TIM layer may be made of any one selected among alumina, silicon nitride, aluminum nitride, zinc oxide, titanium dioxide, and silica.

According to another example of the present invention, the TIM layer may be formed by dispersing any one selected among alumina, silicon nitride, aluminum nitride, zinc oxide, titanium dioxide, and silica in a form of particles in a polymer.

In addition, the polymer may be any one selected among polytetrafluoroethylene (PTFE), polyethylenceterephthalate (PET), polyethersulfone (PES), polyimide (PI), polycarbonate (PC), polyurethane (PU), polymethylmethacrylate (PMMA), and polyethylenenaphthalate (PEN).

According to another example of the present invention, the TIM layer may be provided with copper layers formed at opposite surfaces of the TIM layer by any one method selected among brazing, oxidizing, plating, and pasting.

According to another example of the present invention, the semiconductor chip may be bonded using any one or an alloy of two or more selected among copper (Cu), silver (Ag), aluminum (Al), nickel (Ni), tin (Sn), and molybdenum (Mo).

According to another example of the present invention, the semiconductor chip may include an insulated-gate bipolar transistor (IGBT) and a diode.

According to another example of the present invention, a casing for making the power semiconductor module airtight may be provided; and the first heat dissipation substrate may be formed being in contact with a lower part of the casing, and the second heat dissipation substrate may be formed being in contact with an upper part of the casing.

According to another example of the present invention, a casing for making the power semiconductor module airtight may be provided; and at a lower part of the casing, a part of the first heat dissipation substrate may be formed penetrating through the casing and protruding to outside, and at an upper part of the casing, a part of the second heat dissipation substrate may be formed penetrating through the casing and protruding to outside.

The present invention provides a power semiconductor module including: a first heat dissipation substrate that is a base plate; a substrate having a multi-layer structure formed on the first heat dissipation substrate; a semiconductor chip positioned on the substrate having the multi-layer structure, and formed in a form of a flip chip by being bonded to the substrate having the multi-layer structure; a lead plate positioned on the semiconductor chip; a thermal interface material layer (TIM layer) formed on the lead plate; and a second heat dissipation substrate formed on the TIM layer.

According to another example of the present invention, the second heat dissipation substrate may be of a flat type, a pin type, or a fin type.

According to another example of the present invention, a plate-type casing for covering the power semiconductor module may be provided on the second heat dissipation substrate, and an upper portion of the second heat dissipation substrate may be formed being in contact with a lower surface of the casing.

According to another example of the present invention, a plate-type casing for covering the power semiconductor module may be provided on the second heat dissipation substrate, and a part of the second heat dissipation substrate may be formed penetrating through the casing.

According to another example of the present invention, the semiconductor chip may include an insulated-gate bipolar transistor (IGBT) and a diode.

Advantageous Effects

In the conventional power semiconductor module, the semiconductor chip is electrically connected through wire bonding, and thus it is difficult to design a heat dissipation means to be placed above the semiconductor chip due to the wire made of an aluminum material.

According to the power semiconductor module of the present invention, a lead plate is applied rather than a wire of an aluminum material, and a heat dissipation plate is placed above the semiconductor chip, whereby superior heat dissipation performance is facilitated through vertically bidirectional heat dissipation.

In addition, the PCB is placed above the semiconductor chip, thereby reducing the size of the whole casing.

DESCRIPTION OF DRAWINGS

FIG. 5 A.

BEST MODE

In order to fully understand the present invention, operational advantages of the present invention, and objectives achieved by an embodiment of the present invention, the accompanying drawings and the contents described therein, which illustrate exemplary embodiments of the present invention, should be referenced.

In describing the exemplary embodiments of the present invention, a description of known techniques that make the subject matter of the present invention unclear or a repeated description will be shortened or omitted.

Hereinafter, a power semiconductor module according to an embodiment of the present invention will be described with reference to FIG. 3 to FIG. 6.

First Embodiment

Figure 3:
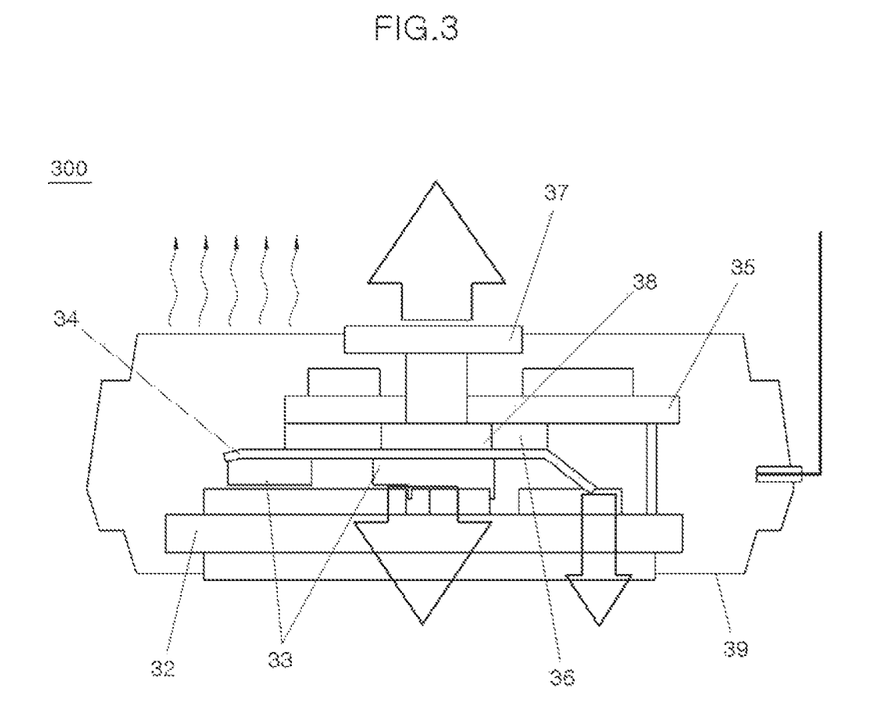
FIG. 3 shows an embodiment of a power semiconductor module according to the present invention.

FIG. 3 shows a power semiconductor module according to a first embodiment of the present invention.

A power semiconductor module 300 of the present invention may include: a first heat dissipation substrate 32; a semiconductor chip 33 positioned on the first heat dissipation substrate 32 and bonded in the form of a flip chip to the first heat dissipation substrate 32; and a thermal interface material layer (TIM layer) 38 positioned on the semiconductor chip 33.

The first heat dissipation substrate 32 of the present invention may be used as a combination of a substrate having a multi-layer structure and a base plate (not shown). The substrate having a multi-layer structure may be a multi-layer substrate such as a metal-ceramic substrate, a ceramic-metal substrate, a metal-ceramic-metal substrate, or the like, and preferably is a direct bonded copper (DBC) substrate that is a copper (Cu)-ceramic-copper (Cu) stack.

In the case where the base plate is positioned under the substrate having the multi-layer structure, the substrate having the multi-layer structure may be provided on the base plate in an integrated manner, or the substrate having the multi-layer structure may be formed by being bonded onto the base plate via a bonding layer, for example, soldering. In the case where the substrate having the multi-layer structure is provided on the base plate in an integrated manner, solder between the base plate and the substrate having the multi-layer structure is removed, so that the heat dissipation performance is improved.

The semiconductor chip 33 of the present invention may be positioned on the first heat dissipation substrate 32 and bonded in the form of a flip chip to the first heat dissipation substrate 32. Soldering may be used to attach the semiconductor chip 33 onto the substrate. When attaching the semiconductor chip 33 to a circuit substrate, an electrode pattern at the bottom surface of the semiconductor chip 33 is used and fused as it is without using an additional connection structure such as metal lead, or an intermediate medium such as a ball grid array, thereby forming the form of a flip chip. As described above, by not using lead, the present invention is advantageous for manufacturing in a small size and for weight lightening, and also for heat dissipation characteristics because the distance between electrodes is made much minute. In particular, since the semiconductor chip 33 has the form of a flip chip, the heat dissipation performance is improved due to bidirectional heat dissipation, and the thermal resistance of doped silicon is reduced, thereby improving contact heat dissipation of a chip junction part.

The semiconductor chip 33 of the present invention may be a diode, an IGBT element, or the like. Bonding may be achieved using any one or an alloy of two or more selected among copper (Cu), silver (Ag), aluminum (Al), nickel (Ni), tin (Sn), and molybdenum (Mo), but is not limited thereto.

The TIM layer 38 of the present invention may be formed on a lead plate 34, and the lead plate 34 may be formed on the semiconductor chip 33. The TIM layer 38 may be made of any one selected among alumina, silicon nitride, aluminum nitride, zinc oxide, titanium dioxide, silica. Alternatively, the TIM layer 38 may be formed by dispersing any one selected among alumina, silicon nitride, aluminum nitride, zinc oxide, titanium dioxide, and silica in the form of particles in a polymer. As the polymer, any one selected among polytetrafluoroethylene (PTFE), polyethylenecterephthalate (PET), polyethersulfone (PES), polyimide (PI), polycarbonate (PC), polyurethane (PU), polymethylmethacrylate (PMMA), and polyethylenenaphthalate (PEN) may be used, but no limitation thereto is imposed. As described above, inorganic film particles are dispersed in a polymer for use, resulting in elasticity.

Regarding the TIM layer 38, a copper layer may be formed at the opposite surfaces of the TIM layer 38 by any one method selected among brazing, oxidizing, plating, and pasting. Further, a first copper layer may be formed at an upper side of the TIM layer 38, and a second copper layer may be formed at a lower side of the TIM layer 38. A lower portion of a second heat dissipation substrate 37 may be formed in such a manner as to be in contact with the first copper layer at the upper side of the TIM layer 38.

A PCB 35 of the present invention may be formed on the TIM layer 38. As described above, since the PCB 35 is provided above the semiconductor chip 33, the power semiconductor module reducing the size of a casing 39 is designed, compared to the case where a PCB is positioned at the side of a semiconductor chip.

The second heat dissipation substrate 37 of the present invention may be formed on the PCB 35. The second heat dissipation substrate 37 may be of a flat type, a pin type, or a fin type. The lower portion of the second heat dissipation substrate 37 is formed penetrating through the PCB 35 and being in contact with the TIM, thereby facilitating heat dissipation characteristics.

The power semiconductor module according to the present invention is provided with the first heat dissipation substrate 32 at the lower position and is provided with the second heat dissipation substrate 37 at the upper position, so that superior heat dissipation performance is facilitated through dualization of a heat dissipation structure. For example, heat dissipation is performed through the second heat dissipation substrate 37 upwards from the lead plate 34, and heat dissipation is performed through the first heat dissipation substrate 32 downwards from the semiconductor chip 33. Regarding the performance of downward heat dissipation, heat dissipation may be performed by providing a heat sink below the base plate.

The lead plate 34 of the present invention may be provided on the semiconductor chip 33. Compared to using a wire, the lead plate 34 is able to electrically connect the elements of the semiconductor chip 33 as well as effectively transmit the heat generated from the semiconductor chip 33 upwards to the second heat dissipation substrate 37. Accordingly, the semiconductor chip 33 is connected to the first heat dissipation substrate 32 by the lead plate 34 without being bonded with a wire, so that the heat dissipation performance may be improved, compared to a wire of an aluminum material. As the lead plate 34, any one or an alloy of two or more selected among copper (Cu), silver (Ag), and aluminum (Al) may be used, but copper is most preferable in terms of electrical characteristics and heat transfer.

To attach the lead plate 34 and the PCB 35, an adhesive layer 36 may be provided. Above the semiconductor chip 33, the PCB 35 is provided via, the adhesive layer 36, and the PCB 35 may be electrically connected to the first heat dissipation substrate 32.

As the adhesive layer 36, a heat insulating material may be used. For example, a heat insulating material having a thermal conductivity of 0.001 to 0.01 W/m-K may be used. Preferably, a heat insulating material having a thermal conductivity of 0.003 to 0.009 W/m-K is used. More preferably, a heat insulating material having a thermal conductivity of 0.006 to 0.08 W/m-K is used.

As the adhesive layer 36 having such low thermal conductivity, a polymer may be used. Alternatively, an adhesive layer 36 that is composed of nano-sized particles and has a porous structure may be used. The adhesive layer 36 may be composed of nanoparticles each having a diameter of 1 to 50 nm. Preferably, the adhesive layer 36 is composed of nanoparticles each having a diameter of 10 to 40 nm. More preferably, the adhesive layer 36 is used which is composed of nanoparticles each having a diameter of 20 to 30 nm, and also has a porous structure. For example, as the adhesive layer 36, aerogel may be used. Compared to a polymer, by using the adhesive layer 36 that is composed of such nanoparticles and has the porous structure, the thermal conductivity may be lowered to $\frac{1}{10}$ to $\frac{1}{100}$.

The casing 39 of the present invention may be configured in the form of packaging the first heat dissipation substrate 32, the semiconductor chip 33, the lead plate 34, the PCB 35, and the second heat dissipation substrate 37, and making the package airtight.

Figure 4A:
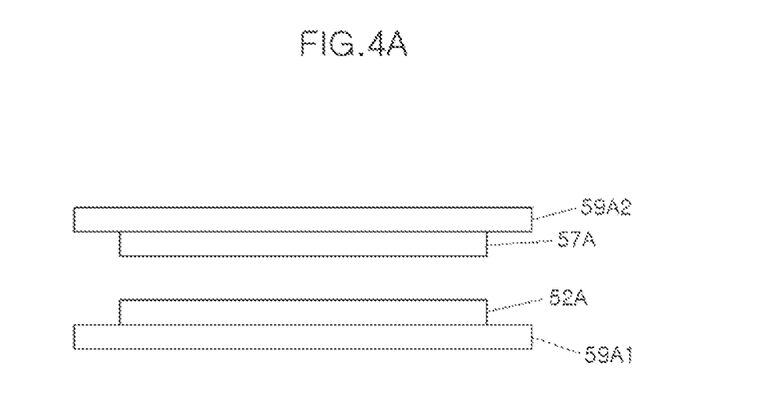
FIG. 4A, FIG. 4B and FIG. 4C show an example of a schematic diagram in which a heal dissipation substrate is attached to a casing.
Figure 4B:
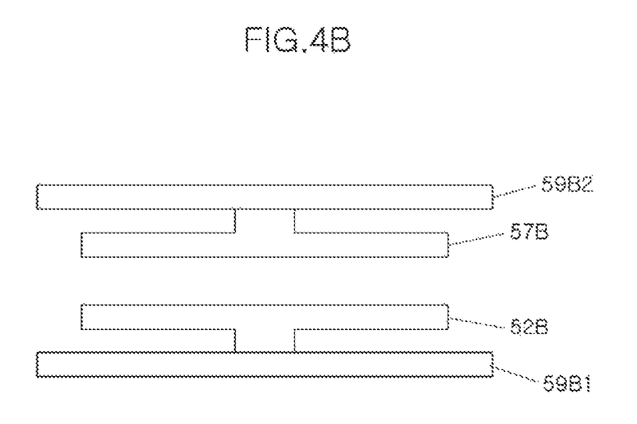
Figure 4C:
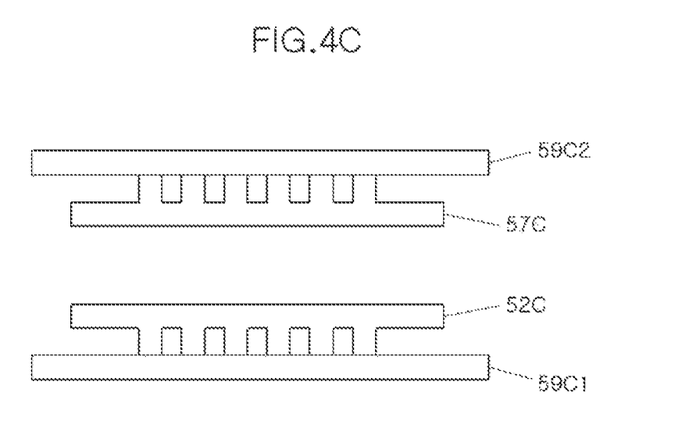

Next, as shown in FIG. 4A, FIG. 4B and FIG. 4C, it will be described that the first heat dissipation substrate 32 and the second heat dissipation substrate 37 shown in FIG. 3 may be formed being in contact with the casing or protruding through a part of the casing.

For example, as shown in FIG. 4A, FIG. 4B and FIG. 4C, the first heat dissipation substrate 52A to 52C and the second heat dissipation substrate 57A to 57C may be formed being in contact with the casing. As shown in FIG. 4A, an upper surface of a casing 59A1 and a lower surface of the first heat dissipation substrate 52A are in contact with each other so that heat dissipation is achieved. A lower surface of a casing 59A2 and an upper surface of the second heat dissipation substrate 57A are in contact with each other so that heat dissipation is achieved. As shown in FIG. 4B, an upper surface of a casing 59B1 and a pin of the first heat dissipation substrate 52B are in contact with each other so that heat dissipation is achieved. A lower surface of a casing 59B2 and a pin of the second heat dissipation substrate 57B are in contact with each other so that heat dissipation is achieved. As shown in FIG. 4C, an upper surface of a casing 59C1 and a fin of the first heat dissipation substrate 52C are in contact with each other so that heat dissipation is achieved. A lower surface of a casing 59C2 and a fin of the second heat dissipation substrate 57C are in contact with each other so that heat dissipation is achieved. Although not shown, the first heat dissipation substrate and the second heat dissipation substrate may facilitate the heat dissipation characteristics in different combinations. For example, the first heat dissipation substrate 32 and the second heat dissipation substrate 34 shown in FIG. 3 are any one among: the first and the second heat dissipation substrate 52A and 57A of the flat types shown in FIG. 4A; the first and the second heat dissipation substrate 52B and 57B of the pin types shown in FIG. 4B; and the first and the second heat dissipation substrate 52C and 57C of the fin types shown in FIG. 4C. The first heat dissipation substrate and the second heat dissipation substrate may be used in different types.

Figure 5A:
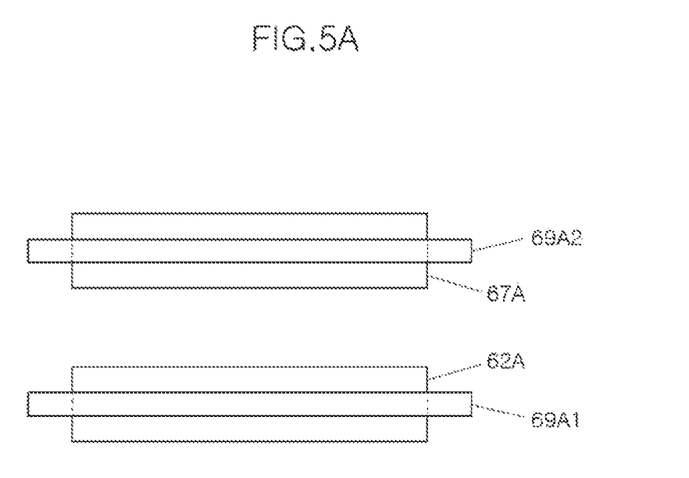
Figure 5B:
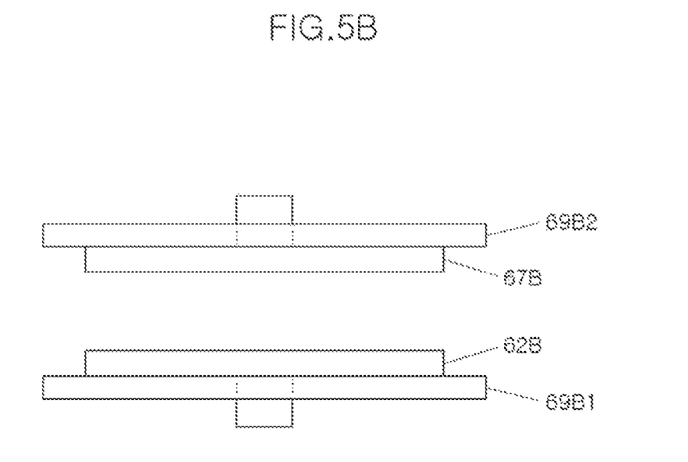
FIG. 5B and FIG. 5C show another example of a schematic diagram in which a heat dissipation substrate is attached to a casing.
Figure 5C:
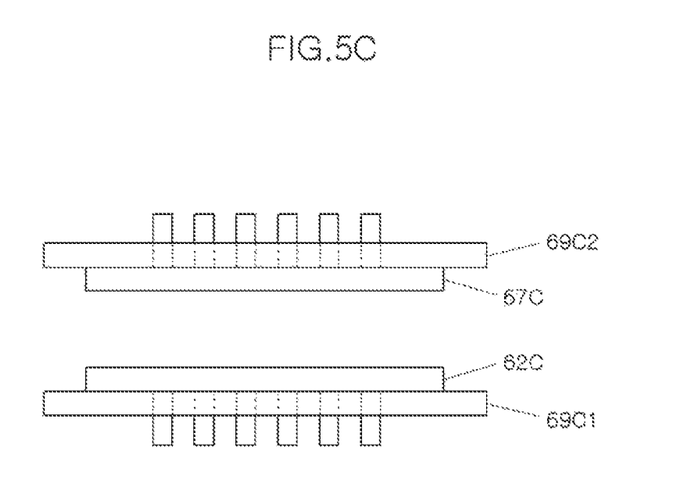

FIG. 5A, FIG. 5B and FIG. 5C shows, as another example, a schematic diagram in which a part of the first heat dissipation substrate 32 and a part of the second heat dissipation substrate 37 shown in FIG. 3 are formed protruding through a part of the casing. FIG. 5A shows that a part of a first heat dissipation substrate 62A of the flat type protrudes through a lower part of a casing 69A and a part of a second heat dissipation substrate 67A of the flat type protrudes through an upper part of the casing 69A so that heat dissipation is achieved. FIG. 5B shows that a pin of a first heat dissipation substrate 62B of the pin type protrudes through a lower part of a casing 69B and a pin of a second heat dissipation substrate 67B of the pin type protrudes through an upper part of the casing 69B so that heat dissipation is achieved. FIG. 5C shows that a fin of a first heat dissipation substrate 62C of the fin type protrudes through a lower part of a casing 69C and a fin of a second heat dissipation substrate 67C of the fin type protrudes through an upper part of the casing 69C so that heat dissipation is achieved. Although not shown, the first heat dissipation substrate and the second heat dissipation substrate may facilitate the heat dissipation characteristics in different combinations. For example, each of the first heat dissipation substrate and the second heat dissipation substrate is of any one among the flat type, the pin type, and the fin type, and the first heat dissipation substrate and the second heat dissipation substrate may be used in different types.

When the thermal conductance of the first heat dissipation substrate and the second heat dissipation substrate is higher than the thermal conductance of the casing, a part of the first heat dissipation substrate and a part of the second heat dissipation substrate are provided protruding to the outside of the casing, thereby increasing the efficiency of heat conduction by external air.

According to the power semiconductor module of the present invention, the first heat dissipation substrate is provided at the lower position and the second heat dissipation substrate is provided at the upper position, so that the power semiconductor module within the casing may have superior heat dissipation performance through dualization of the heat dissipation structure.

Second Embodiment

Figure 6:
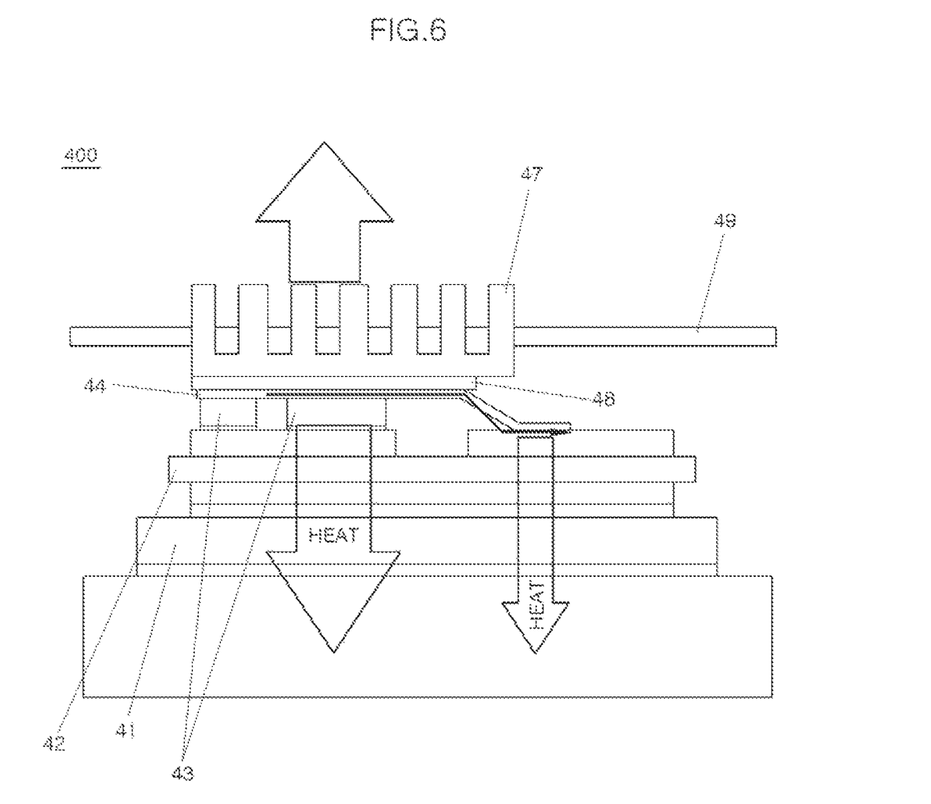
FIG. 6 shows another embodiment of a power semiconductor module according to the present invention.

FIG. 6 shows a power semiconductor module according to a second embodiment of the present invention.

As shown in FIG. 6, the power semiconductor module of the present invention may include: a first heat dissipation substrate 41 of a base plate; a substrate 42 having a multi-layer structure formed on the first heat dissipation substrate 41; a semiconductor chip 43 positioned on the substrate 42 having the multi-layer structure, and formed in the form of a flip chip by being bonded to the substrate 42 having the multi-layer structure; a lead plate 44 formed on the semiconductor chip 43; a thermal interface material layer (TIM layer) 48 formed on the lead plate 44; and a second heat dissipation substrate 47 formed on the TIM layer 48.

The substrate 42 having a multi-layer structure may be a multi-layer substrate such as a metal-ceramic substrate, a ceramic-metal substrate, a metal-ceramic-metal substrate, or the like, and preferably is a direct bonded copper (DBC) substrate that is a copper (Cu)-ceramic-copper (Cu) stack.

The substrate 42 having the multi-layer structure may be provided on the first heat dissipation substrate 41 in an integrated manner, or the substrate 42 having the multi-layer structure may be formed by being bonded onto the first heat dissipation substrate 41 via a bonding layer, for example, soldering. In the case where the substrate 42 having the multi-layer structure is provided on the first heat dissipation substrate 41 in an integrated manner, solder between the first heat dissipation substrate 41 and the substrate 42 having the multi-layer structure is removed, so that the heat dissipation performance is improved.

The semiconductor chip 43 of the present invention may be positioned on the substrate 42 having the multi-layer structure and bonded in the form of a flip chip to the substrate 42 having the multi-layer structure. Soldering may be used to attach the semiconductor chip 43 onto the substrate. When attaching the semiconductor chip 43 to a circuit substrate, an electrode pattern at the bottom surface of the semiconductor chip 43 is used and fused as it is without using an additional connection structure such as metal lead, or an intermediate medium such as a ball grid array, thereby forming the form of a flip chip. As described above, by not using lead, the present invention is advantageous for manufacturing in a small size and for weight lightening, and also for heat dissipation characteristics because the distance between electrodes is made much minute. In particular, since the semiconductor chip 43 has the form of a flip chip, the heat dissipation performance is improved due to bidirectional heat dissipation, and the thermal resistance of doped silicon is reduced, thereby improving contact heat dissipation of a chip junction part.

The semiconductor chip 43 of the present invention may be a diode, an IGBT element, or the like. Bonding may be achieved using any one or an alloy of two or more selected among copper (Cu), silver (Ag), aluminum (Al), nickel (Ni), tin (Sn), and molybdenum (Mo), but is not limited thereto.

The TIM layer 48 of the present invention may be formed on a lead plate 44, and the lead plate 44 may be formed on the semiconductor chip 43. The TIM layer 48 may be made of any one selected among alumina, silicon nitride, aluminum nitride, zinc oxide, titanium dioxide, silica. Alternatively, the TIM layer 48 may be formed by dispersing any one selected among alumina, silicon nitride, aluminum nitride, zinc oxide, titanium dioxide, and silica in the form of particles in a polymer. As the polymer, any one selected among polytetrafluoroethylene (PTFE), polyethyleneterephthalate (PET), polyethersulfone (PES), polyimide (PI), polycarbonate (PC), polyurethane (PU), polymethylmethacrylate (PMMA), and polyethylenenaphthalate (PEN) may be used, but no limitation thereto is imposed. As described above, inorganic film particles are dispersed in a polymer for use, resulting in elasticity.

Regarding the TIM layer 48, a copper layer may be formed at the opposite surfaces of the TIM layer 48 by any one method selected among brazing, oxidizing, plating, and pasting. Further, a first copper layer may be formed at an upper side of the TIM layer 48, and a second copper layer may be formed at a lower side of the TIM layer 48. A lower portion of a second heat dissipation substrate 47 may be formed in such a manner as to be in contact with the first copper layer at the upper side of the TIM layer 48.

The power semiconductor module according to the present invention is provided with the first heat dissipation substrate 41 at the lower position and is provided with the second heat dissipation substrate 47 at the upper position, so that superior heat dissipation performance is facilitated through dualization of a heat dissipation structure. For example, heat dissipation is performed through the second heat dissipation substrate 47 upwards from the lead plate 44, and heat dissipation is performed through the first heat dissipation substrate 41 downwards from the semiconductor chip 43. Regarding the performance of downward heat dissipation, heat dissipation may be performed by providing a heat sink below the base plate.

The lead plate 44 of the present invention may be provided on the semiconductor chip 43. Compared to using a wire, the lead plate 44 is able to electrically connect the elements of the semiconductor chip 43 as well as effectively transmit the heat generated from the semiconductor chip 43 upwards to the second heat dissipation substrate 47. Accordingly, the semiconductor chip 43 is connected to the first heat dissipation substrate 41 by the lead plate 44 without being bonded with a wire, so that the heat dissipation performance may be improved, compared to a wire of an aluminum material. As the lead plate 44, any one or an alloy of two or more selected among copper (Cu), silver (Ag), and aluminum (Al) may be used, but copper is most preferable in terms of electrical characteristics and heat transfer.

A casing 49 of the present invention may be provided in the form of a plate on the second heat dissipation substrate 47.

That is, as shown in FIG. 6, the second heat dissipation substrate 47 may be formed, protruding through a part of the casing 49. For example, although not shown, as in the above-described embodiments, a plate-type casing for covering the power semiconductor module is provided on the second heat dissipation substrate 47, and the upper portion of the second heat dissipation substrate 47 may be formed being in contact with the lower surface of the casing. Alternatively, as shown in FIG. 6, the plate-type casing 49 for covering the power semiconductor module may be provided on the second heat dissipation substrate 47, and a part of the second heat dissipation substrate 47 may be formed penetrating through the casing 49.

According to this configuration, when the thermal conductance of the second heat dissipation substrate 47 is higher than the thermal conductance of the casing 49, a part of the second heat dissipation substrate 47 is provided protruding to the outside of the casing 49, thereby increasing the efficiency of heat conduction by external air.

The present invention has been described with reference to the illustrated drawings, but is not limited to the described embodiments, and it is apparent to those skilled in the art that various variations and modifications may be made without departing from the spirit and the scope of the present invention. Accordingly, such modifications and variations should be understood as falling within the claims of the present invention, and the scope of the present invention should be interpreted based on the accompanying claims.

DESCRIPTION OF THE REFERENCE NUMERALS IN THE DRAWINGS

32, 42, 52A, 52B, 52C: first heat dissipation substrate
33, 43: semiconductor chip
34, 44: lead plate
35: PCB
36: adhesive layer
37, 47, 57A, 57B, 57C: second heat dissipation substrate
38, 48: TIM
39, 49: casing

The invention claimed is:

1. A power semiconductor module comprising:
a first heat dissipation substrate;
a semiconductor chip positioned on the first heat dissipation substrate, and bonded in a form of a flip chip to the first heat dissipation substrate;
a lead plate provided directly on the semiconductor chip;
a thermal interface material layer (TIM layer) positioned on the lead plate;
a printed circuit board (PCB) formed on the TIM layer; and
a second heat dissipation substrate formed on the PCB,
wherein a first copper layer is formed at an upper side of the TIM layer, a second copper layer is formed at a lower side of the TIM layer, and a lower portion of the second heat dissipation substrate is formed penetrating through the PCB and in contact with the first copper layer at an upper side of the TIM layer.

2. The power semiconductor module of claim 1, wherein an adhesive layer is provided to attach the lead plate and the PCB.

3. The power semiconductor module of claim 2, wherein the adhesive layer is composed of nanoparticles each having a diameter of 1 to 50 nm, and has a porous structure.

4. The power semiconductor module of claim 1, wherein the TIM layer is made of any one selected among alumina, silicon nitride, aluminum nitride, zinc oxide, titanium dioxide, and silica.

5. The power semiconductor module of claim 1, wherein the TIM layer is formed by dispersing any one selected among alumina, silicon nitride, aluminum nitride, zinc oxide, titanium dioxide, and silica in a form of particles in a polymer.

6. The power semiconductor module of claim 5, wherein the polymer is any one selected among polytetrafluoroethylene (PTFE), polyethylenceterephthalate (PET), polyethersulfone (PES), polyimide (PI), polycarbonate (PC), polyurethane (PU), polymethylmethacrylate (PMMA), and polyethylenenaphthalate (PEN).

7. The power semiconductor module of claim 1, wherein the TIM layer is provided with oxidized or plated copper layers formed at opposite surfaces of the TIM layer.

8. The power semiconductor module of claim 1, wherein the semiconductor chip is bonded using any one or an alloy of two or more selected among copper (Cu), silver (Ag), aluminum (Al), nickel (Ni), tin (Sn), and molybdenum (Mo).

9. The power semiconductor module of claim 1, wherein the semiconductor chip includes an insulated-gate bipolar transistor (IGBT) and a diode.

10. The power semiconductor module of claim 1, wherein a casing for making the power semiconductor module airtight is provided, and
the first heat dissipation substrate is formed being in contact with a lower part of an inside surface of the casing, and the second heat dissipation substrate is formed being in contact with an upper part of an inside surface of the casing.

11. The power semiconductor module of claim 1, wherein a casing for making the power semiconductor module airtight is provided, and at a lower part of the casing, a part of the first heat dissipation substrate is formed penetrating through the casing and protruding to outside, and at an upper part of the casing, a part of the second heat dissipation substrate is formed penetrating through the casing and protruding to outside.

\* \* \* \* \*